(12) United States Patent
Wueest et al.

(10) Patent No.: US 8,320,719 B2
(45) Date of Patent: Nov. 27, 2012

(54) METHOD FOR MANUFACTURING A FIBER OPTIC CURRENT SENSOR WITH INHERENT TEMPERATURE COMPENSATION OF THE FARADAY EFFECT

(75) Inventors: Robert Wueest, Zurich (CH); Andreas Frank, Zurich (CH); Klaus Bohnert, Oberrohrdorf (CH); Philippe Gabus, Nussbaumen (CH)

(73) Assignee: ABB Research Ltd, Zürich (CH)

( * ) Notice: Subject to any disclaimer, the term of this patent is extended or adjusted under 35 U.S.C. 154(b) by 239 days.

(21) Appl. No.: 12/891,399

(22) Filed: Sep. 27, 2010

(65) Prior Publication Data

US 2011/0072858 A1 Mar. 31, 2011

(30) Foreign Application Priority Data

Sep. 30, 2009 (EP) .................................. 09171887

(51) Int. Cl.
*G02B 6/00* (2006.01)
*C03B 37/07* (2006.01)
*G01R 31/00* (2006.01)

(52) U.S. Cl. ................ 385/12; 385/11; 324/96; 324/95; 65/485

(58) Field of Classification Search .................... 385/12, 385/11, 31; 324/96, 95; 65/485; 250/227.11, 250/227.14, 227.19, 227.17
See application file for complete search history.

(56) References Cited

U.S. PATENT DOCUMENTS

| | | | |
|---|---|---|---|
| 4,894,608 A | 1/1990 | Ulmer, Jr. | |
| 5,780,847 A | 7/1998 | Dawson et al. | |
| 5,953,121 A | 9/1999 | Bohnert et al. | |
| 6,301,400 B1 * | 10/2001 | Sanders | 385/12 |
| 6,628,869 B2 | 9/2003 | Bohnert et al. | |
| 6,734,657 B2 | 5/2004 | Bohnert et al. | |
| 7,075,286 B2 * | 7/2006 | Bohnert | 324/96 |
| 7,339,680 B2 | 3/2008 | Bohnert et al. | |
| 2001/0002944 A1 | 6/2001 | Bohnert et al. | |
| 2001/0050551 A1 | 12/2001 | Bohnert et al. | |
| 2004/0101228 A1 * | 5/2004 | Bohnert | 385/12 |
| 2007/0052971 A1 | 3/2007 | Bohnert et al. | |
| 2011/0072858 A1 * | 3/2011 | Wueest et al. | 65/485 |
| 2011/0074393 A1 * | 3/2011 | Wueest et al. | 324/96 |

FOREIGN PATENT DOCUMENTS

| | | |
|---|---|---|
| EP | 1 107 029 B1 | 6/2001 |
| EP | 1 115 000 B1 | 7/2001 |
| EP | 0 856 737 | 9/2002 |

(Continued)

OTHER PUBLICATIONS

European Search Report dated Mar. 4, 2010.

(Continued)

*Primary Examiner* — Brian Healy
(74) *Attorney, Agent, or Firm* — Buchanan Ingersoll & Rooney PC (57) ABSTRACT

A method is provided for tuning the fiber optic retarder of a fiber optic current sensor towards a desired temperature dependence, the sensing fiber is exposed to a magnetic field or corresponding electric current and the sensor signal as well as the signal's dependence on the retarder temperature are measured. From this initial sensor signal and its temperature dependence, a target sensor signal can be determined, at which the dependence on the retarder temperature equals a desired value. Then, the retarder is thermally treated until the sensor signal reaches the target value. The method obviates the need for repetitively measuring the temperature dependence during the tuning process.

9 Claims, 3 Drawing Sheets

FOREIGN PATENT DOCUMENTS

| WO | WO 97/13155 | 4/1997 |
|----|----|----|
| WO | WO 2005/111633 A1 | 11/2005 |

OTHER PUBLICATIONS

K. Bohnert et al., "Temperature and Vibration Insensitive Fiber-Optic Current Sensor", Journal of Lightwave Technology, vol. 20, No. 2, Feb. 1, 2002, pp. 267-276, XP-011030114.

K. Bohnert et al., "Experimental and Theoretical Investigations of the High Current Regime of an Interferometric Fiber-Optic Current Sensor", IEEE Sensors, 2008, pp. 926-929.

Klaus Bohnert et al., "Fiber-Optic Current Sensor for Electrowinning of Metals", Journal of Lightwave Technology, vol. 25, No. 11, Nov. 2007, pp. 3602-3609.

Herve C. LeFevre, "Fundamental of the Interferometric Fiber-Optic Gyroscope", SPIE, Aug. 1996, vol. 2837, pp. 2-17.

Juichi Noda et al., "Polarization-Maintaining Fibers and Their Applications", Journal of Lightwave Technology, vol. LT-4, No. 8, Aug. 1986, pp. 1071-1089.

Z. B. Ren et al., "Temperature Dependence of Bend-and Twist-Induced Birefringence in a Low-Birefringence Fiber", Optics Letters vol. 13, No. 1, Jan. 1988, pp. 62-64.

European Search Report dated Mar. 9, 2010, issued in the corresponding European Application No. 09171889.0-2216.

Wueest et al., U.S. Appl. No. 12/889,775, entitled "Temperature Compensated Fiber Optic Current or Magnetic Field Sensor with Insensitivity to Variations in Sensor Parameters" filed Sep. 24, 2010.

H. Lefevre, "The Fiber-Optic Gyroscope", Artech House, Boston, (1993) Chapters 2, 8, and 10, 16 pp.

\* cited by examiner

METHOD FOR MANUFACTURING A FIBER OPTIC CURRENT SENSOR WITH INHERENT TEMPERATURE COMPENSATION OF THE FARADAY EFFECT

RELATED APPLICATION

This application claims priority under 35 U.S.C. §119 to European Patent Application No. 09177887.4 filed in Europe on Sep. 30, 2009, the entire content of which is hereby incorporated by reference in its entirety.

FIELD

The disclosure relates to the manufacturing of a sensor, such as a fiber optic current sensor (FOCS) that includes a sensing fiber that is exposed to the magnetic field of a current to be measured. This type of sensor is can be used, for example, in high voltage substations or applications with high direct currents (dc).

BACKGROUND INFORMATION

Fiber-optic current sensors (FOCS) commonly rely on the Faraday effect in fused silica fibers. The Faraday-effect varies with temperature. The Verdet constant V of fused silica fiber, which is a measure for the Faraday effect, changes according to $(1/V) \partial V/\partial T = 7 \times 10^{-5} \circ C.^{-1}$, i.e. within a temperature range of operation of e.g. −40° to +80° C. the sensor signal varies within 0.84%. Many applications of FOCS require accuracy to within ±0.2% or ±0.1%, and therefore require measures for temperature compensation.

In EP 1107029, EP 1115000 and K. Bohnert, P. Gabus, J. Nehring, H. Brändle, "Temperature and Vibration Insensitive Fiber-Optic Current Sensor," *J. Lightwave Technol.*, 20(2), 267, (2002), a method is described for inherent temperature compensation of the Faraday effect in interferometric Sagnac and reflection-type fiber-optic current sensors. The method of inherent compensation eliminates the need of an extra temperature sensor, which is particularly important for current sensing at high electric potentials. This method exploits the temperature dependence of the fiber-optic retarder which generates the normally circular light waves propagating in the sensing fiber. For temperature compensation the retardation is set to a value which differs by a non-zero amount ε from the conventional 90°-retardation. The variation of the retardation with temperature, affects the scale factor of the sensor. At the properly chosen retardation, e.g. ε=10°, the influence of the retarder on the sensor sensitivity (normalized scale factor S) balances the variation of the Verdet constant with temperature.

In conventional systems, the retarder is initially prepared with an over-length, i.e., a retardation larger than the target retardation. The proper retardation is then approached by fine-tuning the retardation in a stepwise manner. After each fine-tuning step the retarder contribution to the temperature dependence of the sensor is measured. The measurement involves translating the retarder to a temperature controller, changing the retarder temperature within a certain range and monitoring the resulting effect on the sensor signal for a given current. The fine-tuning is continued until proper compensation is reached. Fine-tuning is done by heating the retarder in the arc or heater filament of a fiber splicer. The heating alters the retarder's linear birefringence and thus retardation, e.g. by diffusion of dopants out of the fiber core and/or by a change in fiber stress.

SUMMARY

An exemplary embodiment is directed to a method for manufacturing a fiber optic current sensor. The fiber optic current sensor includes a sensing fiber to be exposed to a magnetic field of a current I to be measured. The sensing fiber has a Verdet constant V, a birefringent linear phase retardation δ, and at least one fiber optical retarder coupled to said fiber for converting light between linear and elliptical polarization The fiber optic sensor includes a slow axis of said retarder is at an angle 45°−β in respect to a slow axis of said sensing fiber, and wherein a differential retardation ρ induced by said retarder is dependent on temperature, where $$Q = \frac{1}{\rho} \cdot \frac{\partial \rho}{\partial T}.$$

The sensor includes a control unit generating a sensor signal a dependent on a current-induced phase shift Δϕ, in particular proportional to said phase shift Δϕ The phase shift can be represented as $$\Delta\phi = 4S \cdot \phi_F$$

with $\phi_F = V \cdot N \cdot I$, where N is a number of loops of said sensing fiber and S is a scale factor The exemplary method includes exposing said sensing fiber to a magnetic field and measuring a dependence A, of said sensor signal σ on a temperature T of said retarder where $$A = \frac{1}{\sigma} \cdot \frac{\partial \sigma}{\partial T}.$$

The method also includes defining a target dependence B of the sensor signal σ on the temperature T of said retarder, where $$B = \frac{1}{\sigma} \cdot \frac{\partial \sigma}{\partial T}.$$

Additionally, the method includes determining, from A, B, Q, δ and β, a ratio r between an initial sensor signal $\sigma_{ini}$ before a thermal treatment of said retarder and a target sensor signal $\sigma_{fin}$ after a thermal treatment of said retarder, where $$r = \frac{\sigma_{fin}}{\sigma_{ini}}.$$

The exemplary method also includes subjecting said retarder to said thermal treatment and measuring said sensor signal σ until said sensor signal σ has substantially changed by said ratio r.

BRIEF DESCRIPTION OF THE DRAWINGS

The disclosure will be better understood and objects other than those set forth above will become apparent from the following detailed description thereof. Such description makes reference to the annexed drawings, wherein.

DETAILED DESCRIPTION

Exemplary methods disclosed herein provide a more efficient method of tuning the retarder for temperature compensation when manufacturing an FOCS. The method is adapted to manufacture a fiber optic current sensor that includes a sensing fiber exposed to a magnetic field of a current I to be measured, wherein the sensing fiber has a Verdet constant V. The sensing fiber further has bend-induced birefringence or residual linear birefringence remaining after thermal annealing given rise to a birefringent phase retardation δ. This phase retardation δ depends on the type of the fiber, number and radius of the fiber loops, the preparation of the fiber (e.g. annealing, etc.), and whether the fiber is zero or non-zero.

The sensor also includes least one fiber optical retarder coupled to the fiber for converting light between linear and elliptical polarization, wherein a slow axis of the retarder is at an angle 45°−β with respect to a slow axis of the sensing fiber. The retarder induces a differential retardation ρ dependent on temperature with $$Q = \frac{1}{\rho} \cdot \frac{\partial \rho}{\partial T}.$$

The exemplary sensor also includes a control unit generating a sensor signal a dependent on a current-induced phase shift Δϕ, in particular proportional to the phase shift Δϕ, which phase shift can be represented as

Δϕ=4S·ϕ_F, where $\phi_F = V \cdot N \cdot I$, and N is a number of loops of the sensing fiber and S is a scale factor.

The method according to exemplary embodiments provided in the disclosure includes exposing the sensing fiber to a magnetic field and measuring an initial dependence A of said sensor signal a on a temperature T of said retarder, where $$A = \frac{1}{\sigma} \cdot \frac{\partial \sigma}{\partial T}.$$

The method also includes a target dependence B of the sensor signal σ on a temperature T of the retarder, where $$B = \frac{1}{\sigma} \cdot \frac{\partial \sigma}{\partial T}.$$

The exemplary method includes determining, from A, B, Q, δ and β, a ratio r between an initial measured signal $\sigma_{ini}$ at a stage before a thermal treatment of the retarder and a target signal $\sigma_{fin}$ at a final stage after a thermal treatment of the retarder; $\sigma_{ini}$ and $\sigma_{fin}$ are measured with the same values of δ, β and $\phi_F$, where $$r = \frac{\sigma_{fin}}{\sigma_{ini}},$$

and subjecting the retarder to a thermal treatment and measuring the signal σ until the signal has substantially changed by said ratio r.

Accordingly, the exemplary method disclosed herein can obviate, for example, a need to explicitly measure the temperature dependence of σ repetitively during thermal treatment of the fiber as desired. The exemplary method merely can specify, for example, that the signal σ as caused by the magnetic field is being monitored, as desired, until that signal has changed by said ratio r (or, at least, by value close to said ratio r).

The ratio r can be calculated such that $$r(A, B, Q_1, Q_2) = \frac{S\left(\frac{B}{Q_2}, \delta, \beta\right)}{S\left(\frac{A}{Q_1}, \delta, \beta\right)},$$

where S is a scale factor calculated, e.g. by using the equations (3)-(5) below, or an equivalent description, or a linear approximation thereof (e.g. Eq. (6)) for small current induced phase shifts. The quantity ε in equations (3)-(5) (or Eq. (6)) can be calculated with a second order approximation such that $$\varepsilon = \frac{-b + \sqrt{b^2 - 4ac}}{2a},$$

where $$a = 1 + \frac{1}{2}X - \sin(2\beta)\delta\frac{\pi}{4},$$

$$b = \frac{\pi}{2} + \sin(2\beta)\delta(1 + X),$$

and $$c = \sin(2\beta)\delta\frac{\pi}{2} - X$$

where $X=A/Q_1$ when calculating S before thermal treatment and $X=B/Q_2$ when calculating S after thermal treatment. Also, $Q_1$ and $Q_2$ can denote values of Q before and after the thermal treatment. In general, $Q_1$ and $Q_2$ are not equal and, advantageously, at least one of them has been determined prior to manufacturing the sensor. A method to measure $Q_1$ and $Q_2$ is described below.

Sensor Design

Figure 1:
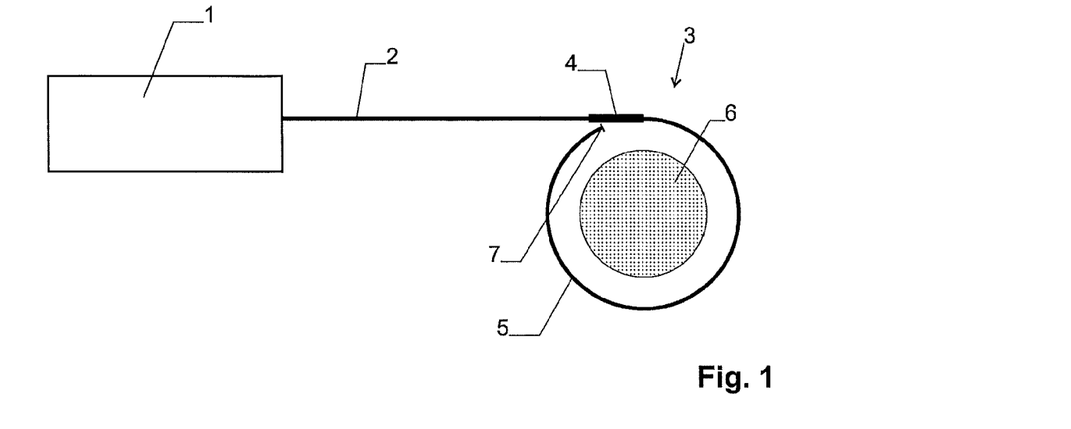
FIG. 1 illustrates a diagram of a fiber-optic current sensor in accordance with an exemplary embodiment.

The working principle of a fiber-optic current sensor is depicted in FIG. 1. FIG. 1 illustrates a diagram of a fiber-optic current sensor in accordance with an exemplary embodiment. As shown in FIG. 1, two orthogonal linearly polarized light waves are sent from a control unit 1 through a connecting polarization-maintaining fiber (pm fiber) 2 to a sensing head, generally denoted by 3. Sensing head 3 includes an optical retarder 4, a sensing fiber 5, and a reflector 7.

Retarder 4 is a fiber optic retarder and converts between the linearly polarized light in pm fiber 2 and elliptically polarized light in sensing fiber 5. It has two principal axes and its length is adapted to induce a differential phase shift $\rho=\pi/2+\epsilon$ between light waves polarized along its principal axes, with $\epsilon$ being an additional, non-zero phase shift.

Sensing fiber 5 is looped N>0 times around a conductor 6 in which the current I is to be measured. Reflector 7 is arranged at the end of sensing fiber 5 for reflecting the light back through sensing fiber 5, retarder 4, pm fiber 2 and into control unit 1. Right and left circular light waves have different phase velocities while traveling in the magnetic field around the conductor due to the Faraday effect. As a result, the light waves acquire a phase difference $\Delta\phi$ given by $$\Delta\phi = 4\cdot\phi_F = 4V\cdot N\cdot I \quad (1)$$

where, V is the Verdet constant of the sensing fiber, N is the number of sensing fiber loops around conductor 6, and I is the current. Eq. (1) is valid for a fiber coil free of any linear birefringence ($\delta=0$) and perfectly circular light waves ($\epsilon=0°$).

After being transformed back into linear polarizations by retarder 4, the magnetic field introduced phase difference is measured by control unit 1, e.g. with a technique adapted from fiber-optic gyroscopes.

Figure 2:
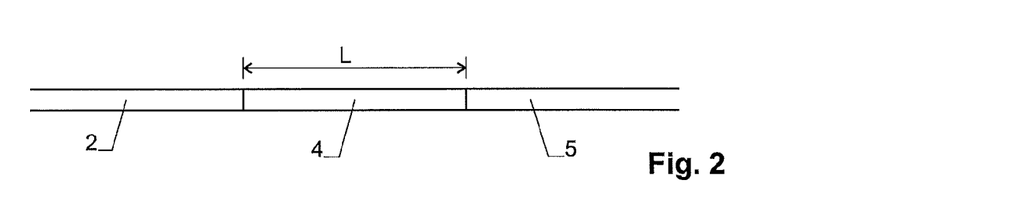
FIG. 2 illustrates a fiber-optic retarder in accordance with an exemplary embodiment.

FIG. 2 illustrates a fiber-optic retarder in accordance with an exemplary embodiment. Retarder 4 can be fabricated out of a polarization maintaining fiber (pm fiber) and spliced to the low birefringence sensing fiber (see FIG. 2) as e.g. described in EP 1107029. The retarder fiber can be made out of one of several types of pm fibers, e.g. elliptical core fibers or fibers with a stress-induced birefringence (Panda, Bowtie or elliptical cladding fibers).

As described in WO 2005/111633 and K. Bohnert, P. Gabus, J. Nehring, H. Brandle, M. Brunzel, "Fiber-Optic Current Sensor for Electrowinning of Metals", *J. Lightwave Technol.*, 25(11), 3602, (2007), the magneto-optic phase shift $\Delta\phi$ of a temperature-compensated sensor ($\rho\neq 90°$) with linear fiber birefringence ($\delta\neq 0°$) can be influenced not only by I, V, and N, but also by the following sensor head parameters: the retardation $\rho=\pi/2+\epsilon$ of the retarder, the birefringence $\delta$ in the sensing fiber and the azimuth angle $\beta$.

Figure 3:
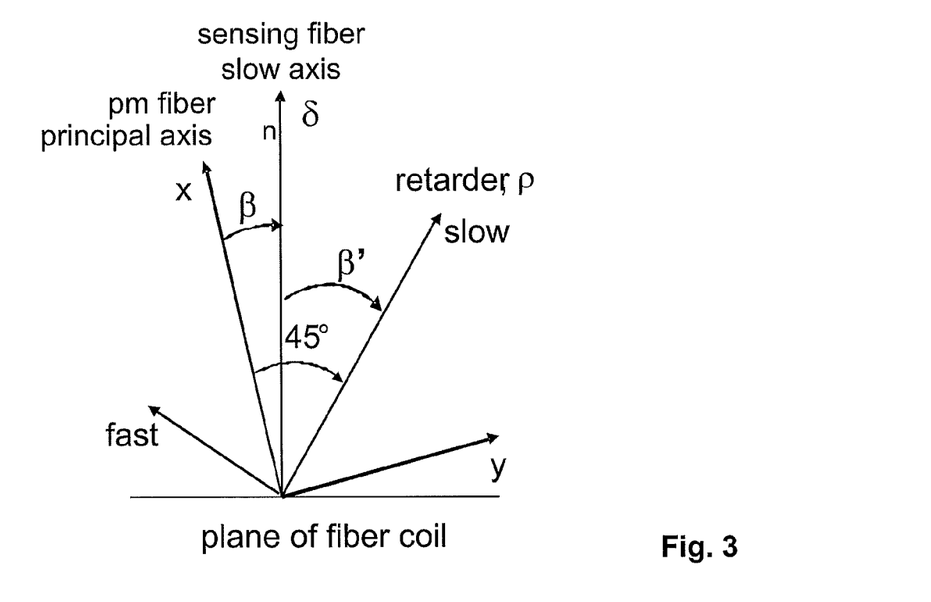
FIG. 3 is a graphical illustration of the rotational position of a retarder with respect to the sensing fiber plane in accordance with an exemplary embodiment.

FIG. 3 is a graphical illustration of the rotational position of the retarder with respect to the sensing fiber plane, in accordance with an exemplary embodiment. The azimuth angle $\beta$ is shown in FIG. 3 as the angle between a first principal axis of the polarizaton maintaining (pm) fiber immediately before retarder 4 and the normal vector n of the plane of the coil of sensing fiber 5. In FIG. 2, the slow principal axis of the retarder fiber is oriented at +45° with respect to a first principal axis of the pm fiber immediately before the retarder as is shown in FIG. 3. It should be understood that to make the definition of $\beta$ unambiguous, the principle axis of the pm fiber 2 can be selected such that the slow principal axis of the retarder fiber is oriented at +45° with respect to the first principal axis of the pm fiber 2. The slow principal axis of the retarder fiber can be then oriented at −45° with respect to the other, second principal axis of the pm fiber 2.

The magneto-optic phase shift $\Delta\phi$ observed by the present device can, at least in linear approximation, i.e. for small magneto-optic phase shifts ($4\phi_F\ll 1$), be represented as $$\Delta\phi = 4S(\epsilon,\delta,\beta)\cdot V\cdot N\cdot I$$

$$\Delta\phi = 4S(\epsilon,\delta,\beta)\phi_F \quad (2)$$

where S is a normalized scale factor which is equal to unity for $\epsilon=0°$ and $\delta=0°$, and $\Delta\phi$ can be defined by $$\Delta\phi = \arctan\left(\frac{2U}{1-U^2}\right) \quad (3)$$

with $$U = \frac{2\varphi_F \frac{\tan(\Gamma)}{\Gamma}}{\cos(\epsilon) - \delta\sin(\epsilon)\sin(2\beta)\frac{\tan(\Gamma)}{\Gamma}}, \quad (4)$$

and $$\Gamma = [\delta^2 + (2\varphi_F)^2]^{\frac{1}{2}}, \quad (5)$$

The sensing fiber can also exhibit some intrinsic fiber linear birefringence $\delta_i$, e.g. due to fiber anisotropies or intrinsic stress. Commonly, $\delta_i$, can be neglected for state-of-the-art low-birefringence sensing fibers, however, and is therefore not considered any further in the following.

For small Faraday phase shifts $\phi_F$, i.e. $\phi_F\ll 1$, and with approximations accurate to within roughly $\Delta S/S=10^{-4}$, the normalized scale factor S is given by:

$$S(\epsilon,\delta,\beta) = \frac{1+\frac{1}{3}\delta^2}{\cos(\epsilon) - \delta\sin(2\beta)\sin(\epsilon)}. \quad (6)$$

The retardation $\rho$ of retarder 4 differs by a proper amount $\epsilon$ (e.g. $\epsilon=10°$ for a particular type of retarder fiber) from the $\pi/2$-retardation of a perfect quarter-wave retarder, in order to compensate for the temperature dependence of the Verdet constant V.

Figure 4:
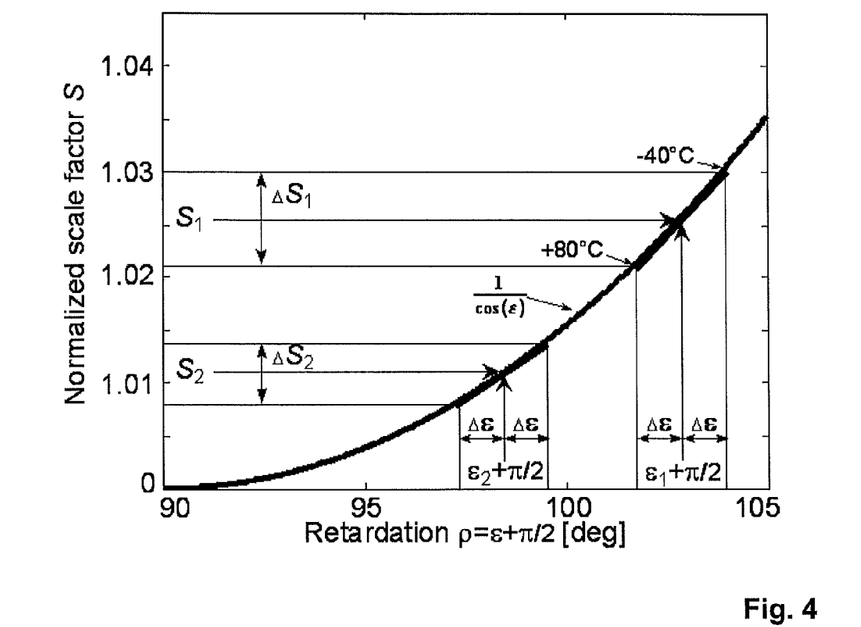
FIG. 4 is a graphical illustration of the normalized scale factor as a function of retardation ρ in accordance with an exemplary embodiment.

FIG. 4 is a graphical illustration of the normalized scale factor as a function of retardation $\rho$ in accordance with an exemplary embodiment. As illustrated in FIG. 4, i.e. the contribution B of the retarder to the temperature dependence of the sensor offsets the contribution of the Verdet constant:

$$B = -\frac{1}{V}\cdot\frac{\partial V}{\partial T}. \quad (7)$$

Temperature independence can be specified as desired in order to fulfill the accuracy requirements of the sensor, e.g. in high voltage substation applications or in the measurement of high dc currents.

In order to accommodate for manufacturing tolerances, one can use the condition $$\left|B + \frac{1}{V}\cdot\frac{\partial V}{\partial T}\right| < t \quad (7')$$

with t being a threshold value smaller than $7*10^{-5}$ 1/K, and in particular smaller than $2*10^{-5}$ 1/K.

Bend-induced and/or packaging related stress and thus birefringence in the sensing fiber can result in a further contribution H to the temperature dependence of the sensor, i.e. H is the temperature dependence of the sensor scale factor associated with effects of birefringence present in the sensing fiber or with effects from packaging the sensor for application as a measurement device. Thus, a more general version of Eq. (7) is given by:

$$B = -\left(\frac{1}{V} \cdot \frac{\partial V}{\partial T} + H\right) \quad (7'')$$

In order to accommodate for manufacturing tolerances, the condition $$\left|B + H + \frac{1}{V} \cdot \frac{\partial V}{\partial T}\right| < t \quad (7''')$$

can be used with t being a threshold value smaller than $7*10^{-5}$ 1/K, and in particular smaller than $2*10^{-5}$ 1/K.

Modifications can be made to Eq. 7" as desired in order to achieve temperature compensation at large magneto-optic phase shifts.

Large Faraday Phase Shifts $\phi_F$

In eq. (7), (7') and (7") or (7''') it can be assumed that the Faraday phase shift $\phi_F$ is small ($\phi_F \ll 1$). This approximation holds reasonably well within the range $\phi_F \approx <0.3$ rad, and in particular <0.1 rad. Significantly larger phase shifts ($\phi_F > 0.3$ rad) can be encountered e.g. in the electrolytic production of metals, for example at aluminum smelters, where currents up to about 500 kA can be measured as desired. Here the term $4\phi_F$ can reach values up to e.g. $2\pi$. As it is obvious from eq. (3)-(5) the scale factor S is then not only a function of $\epsilon$, $\delta$, and $\beta$, but can also depend on $\phi_F$ and thus on the current.

Figure 6:
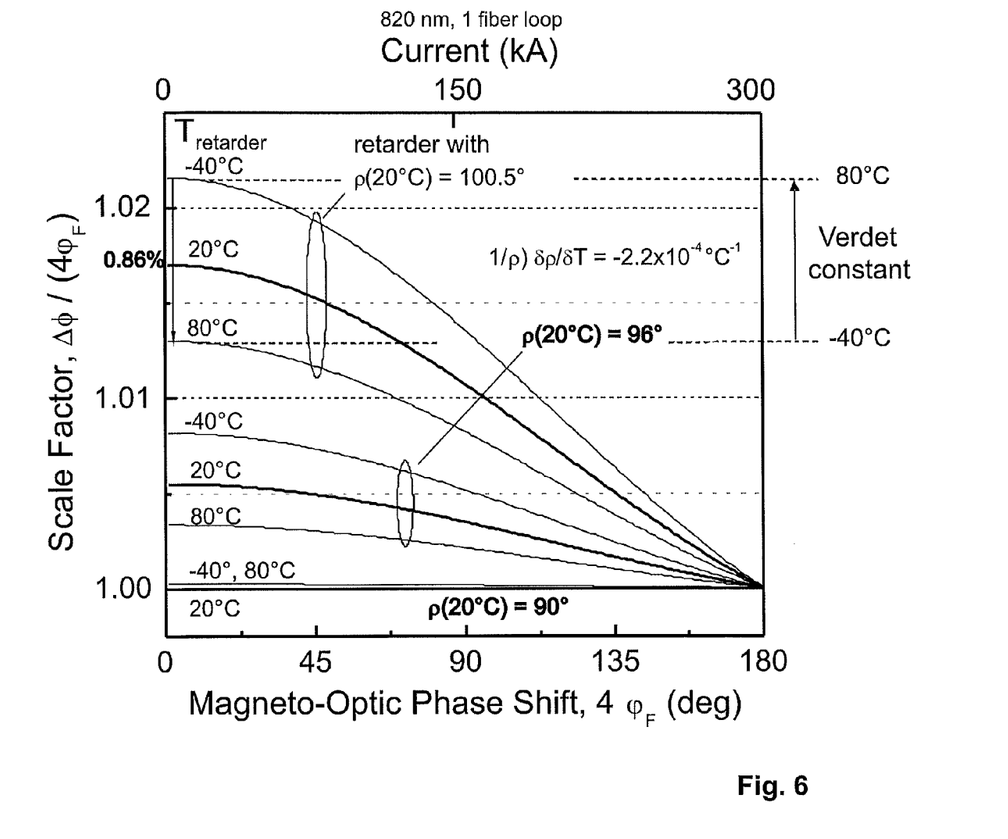
FIG. 6 is a graphical illustration of a scale factor S for a retarder setting ρ in accordance with an exemplary embodiment.

FIG. 6 is a graphical illustration of the scale factor S of a retarder in accordance with an exemplary embodiment. In FIG. 6, the scale factor S is a function of $4\phi_F$ for three different retardations $\rho = \pi/2 + \epsilon$ of the retarder ($\rho = 90°$, $96°$, $100.5°$) with $Q = (1/\rho) \, \delta\rho/\delta T = -2.2 \times 10^{-4}$ °$C^{-1}$. The linear birefringence $\delta$ in the sensing fiber can be assumed to be zero. With $\rho = 100.5°$ the sensor is temperature-compensated for small magneto-optic phase shifts $\phi_F$. Here, the scale factor $S = \Delta\phi/4\phi_F$ decreases by 0.86% from 1.0216 to 1.0130, if the temperature rises from $-40°$ C. to $80°$ C., which just balances the relative increase in the Verdet constant with temperature (vertical arrows in FIG. 6). At increasing magneto-optic phase shifts the low and high temperature curves start to converge and finally cross each other at $4\phi_F = \pi$ (corresponding to I=300 kA for one fiber loop and a wavelength of 820 nm). As a result, the temperature compensation is only partial at a large phase shift and finally disappears at $4\phi_F = \pi$. However, the retarder can be prepared for optimum temperature compensation at an intermediate Faraday phase shift, e.g. at $4\phi_F = \pi/2$. Under these conditions, the sensor can be somewhat overcompensated below $4\phi_F = \pi/2$ and under-compensated above. As should be understood from FIG. 6, that temperature compensation at an intermediate Faraday phase shift requires a value of $\rho$ that is somewhat higher than the value needed for temperature compensation at $\phi_F \ll 1$.

For a given set of parameters $\delta$, $\beta$, and Q, the retardation $\rho$ can be tuned to a value that provides optimum temperature compensation of the Faraday effect at a desired value of the magneto-optic phase shift $4\phi_F$. Given these parameters, the sensor can be compensated for a larger magneto-optic phase shift, and the retarder tuning can still be done at small magnetic fields with $\phi_F \ll 1$. The target temperature dependence B to calculate the target signal $\sigma_{fin}$ can be replaced by $B' = B + \Delta B$, as desired, where $\Delta B$ accounts for the difference between B at small magneto-optic phase shifts ($\sigma_F \ll 1$) and B at the value $4\phi_F$ where optimum temperature compensation is to be achieved.

Conventional Retarder Fabrication Method

In conventional retarder fabrication procedures, the retarder is fabricated with an initial overlength. The retardation is then fine-tuned (reduced) in a stepwise manner until the targeted temperature dependence is reached. An initial over-length is chosen in order to cope with tolerances in the fabrication process. Fine-tuning is done by thermally treating (i.e. heating) the retarder in the arc or heater filament of a fiber splicer. The heating alters the retarder's birefringence and thus its retardation. After each fine-tuning step the retarder's contribution to the temperature dependence of the sensor is measured. The measurement involves translating the retarder to a temperature controller, changing the retarder temperature within a certain range, and measuring the sensor signal at a constant current as a function of the retarder temperature. The fine-tuning is continued until proper compensation is reached. Such a procedure is relatively time consuming.

Retarder Fabrication Method According to an Exemplary Embodiment

In an exemplary embodiment, a time consuming re-measurement of the temperature dependence after each tuning step as performed in the conventional fabrication procedures can be avoided. Rather, only the change of a sensor signal a can be measured, as desired. The change can be measured repeatedly during the fine tuning process without moving the fiber or any other part. The scale factor S and thus a vary with the retardation $\beta$. Signal $\sigma$ may therefore serve as a measure for the contribution B of the retarder to the temperature dependence of the sensor (i.e., assuming that the temperature of the sensing fiber is kept constant).

The exemplary procedure can be specified such that the temperature dependence Q of the retardation $\rho$ can be given by $$Q = \frac{1}{\rho} \frac{\partial \rho}{\partial T} \quad (8)$$

and the initial dependence A of the sensor signal a on a retarder temperature can be given by $$A = \frac{1}{\sigma} \frac{\partial \sigma}{\partial T} = \frac{1}{S_{ini}} \frac{\partial S_{ini}}{\partial T}. \quad (9)$$

An exemplary method for measuring the property Q of the retarder fiber and the fiber beat length $L_B$, is disclosed below, where A can be measured by monitoring signal $\sigma$ while varying the temperature of retarder 4. The retarder adjustment can be performed at small magneto-optic phase shifts ($4\phi_F \ll 1$). The scale factor S as a function of $\epsilon$ is then given by $S(\epsilon) = 1/\cos(\epsilon)$ as is shown in FIG. 4. The retardation $\rho = \pi/2 + \epsilon$ varies with temperature according to $$\rho(T) = \rho_0 \cdot (1 + Q \cdot \Delta T) \quad (10)$$

and hence $$\epsilon(T) = \epsilon_0 + \Delta\epsilon(T) = \epsilon_0 + \rho \cdot Q \cdot \Delta T \quad (11)$$

where $\rho_0 = \rho(T_0)$ and $\epsilon_0 = \epsilon(T_0)$, which is depicted in FIG. 4. $T_0$ usually is the room temperature, and $\Delta T = T - T_0$. The initial dependence $A(\epsilon)$ on the retarder temperature of the initial scale factor $S_{ini}$ and sensor signal a may be expressed as:

$$A = \frac{1}{S_{ini}} \frac{\partial S_{ini}}{\partial T} = \frac{1}{S_{ini}} \frac{\partial S_{ini}}{\partial \varepsilon} \frac{\partial \varepsilon}{\partial T} = \frac{1}{S_{ini}} \frac{\partial S_{ini}}{\partial \varepsilon} \cdot Q\left(\varepsilon + \frac{\pi}{2}\right). \quad (12)$$

The combination of Eqs. (6) and (12) can allow expressions of the initial normalized scale factor $S_{ini}(A, Q_1)$ as a function of the initially measured temperature dependence A of the sensor signal σ and the initial retarder temperature dependence $Q_1$. Similarly, the final normalized scale factor $S_{fin}(B, Q_2)$ may be expressed as a function of the target scale factor temperature dependence B (and target temperature dependence of signal σ), and the retarder temperature dependence $Q_2$ after fine tuning, with B being defined as $$B = \frac{1}{\sigma} \frac{\partial \sigma}{\partial T} = \frac{1}{S_{fin}} \frac{\partial S_{fin}}{\partial T} \quad (13)$$

The retarder temperature dependencies $Q_1$ and $Q_2$ before and after fine tuning, respectively, may slightly differ due to possible changes in fiber properties as a result of the thermal treatment of the fiber. The target signal $\sigma_{fin}$, can be obtained from the initially measured sensor signal $\sigma_{ini}$ and from the ratio of the calculated scale factors $S_{ini}(A, Q_1)$ and $S_{fin}$, (B, $Q_2$)) according to:

$$\sigma_{fin} = \sigma_{ini} \cdot \frac{S\left(\frac{B}{Q_2}\right)}{S\left(\frac{A}{Q_1}\right)} = \sigma_{ini} \cdot r(A, B, Q_1, Q_2). \quad (14)$$

The retarder fabrication and tuning procedure can be summarized as follows:
1. Fabricate a retarder connected to a sensing fiber with retarder having an initial retardation larger than the proper retardation needed for the target temperature dependence B of the scale factor.
2. Measure initial dependence A of sensor signal a on retarder temperature.
3. Measure initial sensor signal $\sigma_{ini}$ at a given magnetic field (or current).
4. Calculate target sensor signal $\sigma_{fin}$ according to Eq. (14).
5. Fine-tune, and again measure sensor signal σ.
6. Repeat fine tuning until calculated target sensor signal $\sigma_{fin}$ is reached.
7. Measure dependence of sensor signal σ on retarder temperature for confirmation that target temperature dependence B has been achieved.

Advantageously, the sensor fiber can be kept straight during the above procedure in order to minimize the bend-induced linear birefringence δ. Afterwards, the fiber can be bent to the final coil with the desired number of fiber loops. In yet another exemplary embodiment, the sensing fiber can be kept bent in a way that generates the same amount of linear birefringence as present in the final coil during the above procedure. In this embodiment, the azimuth angle β may already be set to the value foreseen in the final coil assembly.

Characterization of Fiber Properties in Accordance with an Exemplary Embodiment

The above procedure for setting the correct retardation ρ can be specified so that the thermal coefficients of the retardation $Q_1$ and $Q_2$ before and after fine-tuning are known.

An exemplary embodiment described below includes a method for measuring these values for a given type of fiber.

Even though, $Q_1$ and $Q_2$ can be assumed to be approximately equal, it can be advantageous to take into account that the retarder's temperature coefficient can be altered to some degree by thermal treatment.

Figure 5:
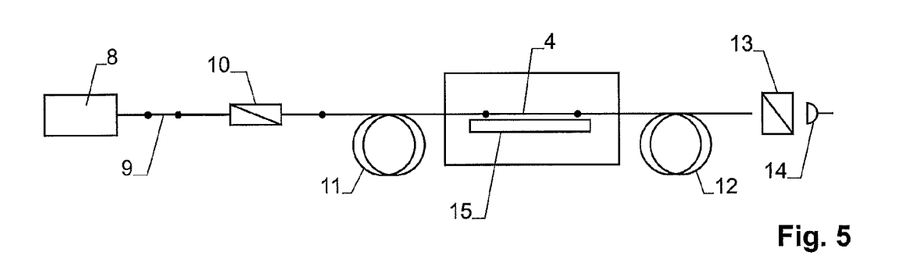
FIG. 5 illustrates a set-up for characterizing the retarder in accordance with an exemplary embodiment.

FIG. 5 illustrates a set-up for characterizing the retarder. A depolarized beam of low coherence light from source 8, e.g. from a super luminescent diode (SLD), with depolarizer 9 is fed into a fiber polarizer 10. The polarized light is then coupled, with the polarization direction parallel to one of the birefringent axes, into a PM fiber 11 followed by phase retarder 4 of length L under test. Retarder 4 is fabricated at the end of the fiber 11 such that the resulting fiber 12 is not a low-birefringence sensing fiber but another polarization maintaining fiber. The birefringent axes of fiber sections 11 and 12 are at 45° to the axes of retarder 4. Fiber 12 strips cladding modes that may be generated at the retarder and introduces a group delay between its orthogonal modes much larger than the coherence length of the low coherent light source.

The light from second PM fiber 12 is sent through a rotating analyzer (i.e. a rotating linear polarizer) 13 and then detected in detector 14. The detector signal is proportional to $D=[1+\sin(h+p)\cdot\cos(\rho)]$, where p is the (rotating) angle (0°-360°) of the analyzer, h is a constant phase corresponding to the arbitrary fiber orientation with respect to the zero position of the analyzer and ρ is again the differential retardation of retarder 4.

Retarder 4 is placed on a temperature controller 15, such as a Peltier element. By changing the temperature of retarder 4, and recording D, the variation of the retardation ρ with temperature and thus the value of Q can be determined. The chosen length of retarder 4 can be arbitrary for the purpose of the characterization. Measuring several retarders with different lengths L allows for a convenient and accurate way to determine the beat length $L_B$ of the PM fiber by fitting $\rho(L)= 2\pi\cdot(L-b)/L_B$ to the measured data. The fitting parameter b accounts for fiber modifications at the splices.

The method can also be used to determine the effect of the thermal treatment of the retarder on the fiber temperature dependence Q.

Derivation of Equations

As discussed above, and as shown in FIG. 4, the sensor scale factor S shows a dependence on ε of $S(\epsilon)=1/\cos(\epsilon)$ (for $\phi_F \ll 1$ and for δ0°. The temperature coefficient Q of the retardation ρ (see Eq. (8)) is typically on the order of $Q=(-1\ldots-6)\cdot10^{-4}\,K^{-1}$ for elliptical core fibers. The quantity $\epsilon=\rho-\pi/2$ changes with temperature as given by Eqs. (10) and (11). The temperature dependence A of Eq. (12) can be determined experimentally. The normalized scale factor S in an approximation for small currents is given by [2]:

$$S = \frac{\Delta\phi}{4\varphi_F} = \frac{1 + \frac{1}{3}\delta^2 + \frac{4}{3}\varphi_F^2}{\cos(\varepsilon) - \delta\sin(\varepsilon)\sin(2\beta)\left(1 + \frac{1}{3}\delta^2 + \frac{4}{3}\varphi_F^2\right)}. \quad (15)$$

We assume that the formula for the scale factor and its temperature dependence should be accurate to a level of $10^{-4}$. In a retarder fabrication setup, the measured Faraday angle is usually small, i.e. $\phi_F < 0.01$ [rad] and the bend induced linear birefringence is small as well, i.e. $\delta < 2° \sim 0.04$ [rad]. The magnitude of ε usually is $\epsilon < 12° \sim 0.2$. If only keeping terms $>10^{-4}$ the Eq. (15) can be simplified:

$$S(\varepsilon) = \frac{\Delta\phi}{4\varphi_F} = \frac{1 + \frac{1}{3}\delta^2}{\cos(\varepsilon) - g\delta\sin(\varepsilon)} \text{ with } g = \sin(2\beta), \quad (16)$$

which corresponds to Eq. (6).

An even more simplified approximation of the scale factor S can be as follows:

$$S(\varepsilon) = \frac{\Delta\phi}{4\varphi_F} = 1 + \frac{1}{2}\varepsilon^2 + \frac{1}{3}\delta^2 + \delta\sin(\varepsilon)\sin(2\beta).$$

The temperature dependence using Eq. (12) now becomes:

$$A = \frac{1}{S}\frac{\partial S}{\partial \varepsilon} \cdot Q\left(\varepsilon + \frac{\pi}{2}\right) = \frac{\sin(\varepsilon) + g\delta\cos(\varepsilon)}{\cos(\varepsilon) - g\delta\sin(\varepsilon)} \cdot Q\left(\varepsilon + \frac{\pi}{2}\right)$$

After a Taylor approximation for the terms containing the small quantity sup to a second order, a quadratic equation can be derived:

$$\frac{A}{Q} = \frac{\varepsilon^2\left(1 - g\delta\frac{\pi}{4}\right) + \varepsilon\left(g\delta + \frac{\pi}{2}\right) + g\delta \cdot \frac{\pi}{2}}{1 - g\delta\varepsilon - \frac{\varepsilon^2}{2}}. \quad (17)$$

This allows calculating the value of ε for a measured dependence A of the sensor signal σ on the temperature at the retarder. Q is known from the characterization of the retarder fiber and δ and β are known from geometrical considerations [2]. The quadratic equation can be solved for ε:

$$\varepsilon = \frac{-b + \sqrt{b^2 - 4ac}}{2a}, \quad (18)$$

where $$a = 1 + \frac{1}{2}\frac{A}{Q} - \sin(2\beta)\delta\frac{\pi}{4},$$

$$b = \frac{\pi}{2} + \sin(2\beta)\delta\left(1 + \frac{A}{Q}\right), \text{ and}$$

$$c = \sin(2\beta)\delta\frac{\pi}{2} - \frac{A}{Q}$$

Hence, the initial normalized scale factor $S_{ini}=S(A/Q_1, \delta, \beta)$ can be calculated from the above formulas (16) and (18). The error introduced by the second order approximation compared to a third order Taylor development (and then solving a cubic equation) is small ($\Delta\epsilon/\epsilon \sim 10^{-3}$). With the target dependence B of the sensor signal a on the retarder temperature known, usually $B=-7\cdot10^{-5}$/K to compensate for the Verdet constant change, and the given temperature dependence of the retardation after fine tuning $Q_2$, the final normalized scale factor $S_{fin}=S(B/Q_2, \delta, \beta)$ can be calculated with the same formulas (16) and (18). Ratio r in (14) can then be calculated according to:

$$r(A, B, Q_1, Q_2) = \frac{S\left(\frac{B}{Q_2}, \delta, \beta\right)}{S\left(\frac{A}{Q_1}, \delta, \beta\right)} \quad (19)$$

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

REFERENCE NUMBERS AND SYMBOLS

1: control unit
2: pm fiber (polarization-maintaining fiber)
3: sensing head
4: retarder
5: sensing fiber
6: conductor
7: reflector
8: light source
9: depolarizer
10: polarizer
11, 12: PM fibers
13: rotating analyzer
14: light detector
15: temperature controller
σ: sensor signal
A: initial dependence of the sensor signal on retarder temperature B: final dependence of the sensor signal on retarder temperature
ΔB: difference in B at different magneto-optic phase shifts
b: fitting parameter
D: detected light intensity
h: phase shift
I: current
L: length of retarder
$L_B$: beat length
N: number of sensing fiber loops
p: rotating angle of analyzer
Q: temperature dependence of retardation ρ
$Q_1$, $Q_2$: temperature dependence of ρ before/after thermal treatment of retarder (retarder tuning)
r: ratio between $\sigma_{ini}$ and $\sigma_{fin}$
S: normalized scale factor
$\sigma_{ini}$: sensor signal before retarder tuning
$\sigma_{fin}$: sensor signal after retarder tuning
$S_{ini}$: normalized scale factor before retarder tuning
$S_{fin}$: normalized scale factor after retarder tuning
T: temperature
U: see Eq. (4)
V: Verdet constant of sensing fiber
β: azimuth angle of the retarder
δ: birefringence-induced phase shift in sensing fiber
ε: additional phase shift of retarder (deviation from π/2)
ρ: phase shift of retarder.

What is claimed is:

1. A method for manufacturing a fiber optic current sensor, wherein the fiber optic current sensor comprises:
   a sensing fiber to be exposed to a magnetic field of a current I to be measured, wherein said sensing fiber has a Verdet constant V and a birefringent linear phase retardation $\delta$,
   at least one fiber optical retarder coupled to said fiber for converting light between linear and elliptical polarization, wherein a slow axis of said retarder is at an angle $45°-\beta$ in respect to a slow axis of said sensing fiber, and wherein a differential retardation $\rho$ induced by said retarder is dependent on temperature where $$Q = \frac{1}{\rho} \cdot \frac{\partial \rho}{\partial T},$$

and a control unit generating a sensor signal $\sigma$ dependent on a current-induced phase shift $\Delta\phi$, in particular proportional to said phase shift $\Delta\phi$, which phase shift can be written as $$\Delta\phi = 4S \cdot \phi_F$$

with $\phi_F = V \cdot N \cdot I$, and wherein N is a number of loops of said sensing fiber and S is a scale factor,
   said method comprising:
   exposing said sensing fiber to a magnetic field;
   in an initial step, measuring a dependence A $$A = \frac{1}{\sigma} \cdot \frac{\partial \sigma}{\partial T}$$

of said sensor signal $\sigma$ on a temperature T of said retarder; defining a target dependence;

$$B = \frac{1}{\sigma} \cdot \frac{\partial \sigma}{\partial T}$$

of the sensor signal $\sigma$ on the temperature T of said retarder; determining, from A, B, Q, $\delta$ and $\beta$, a ratio r with $$r = \frac{\sigma_{fin}}{\sigma_{ini}}$$

between an initial sensor signal $\sigma_{ini}$ before a thermal treatment of said retarder and a target sensor signal $\sigma_{fin}$ after a thermal treatment of said retarder; and
   subjecting said retarder to said thermal treatment and measuring said sensor signal $\sigma$ until said sensor signal $\sigma$ has substantially changed by said ratio r.

2. The method of claim 1, wherein said ratio r is calculated from $$r(A, B, Q_1, Q_2, \delta, \beta) = \frac{S\left(\frac{B}{Q_2}, \delta, \beta\right)}{S\left(\frac{A}{Q_1}, \delta, \beta\right)}$$

wherein B is a target dependence of said sensor signal $\sigma$ on the temperature of said retarder, $Q_1$ and $Q_2$ are values of Q before and after said thermal treatment of retarder, respectively, and S is a normalized scale factor given by $$S = \frac{\Delta\phi}{4VNI} = \frac{\Delta\phi}{4\varphi_F}$$

where $\Delta\phi = \arctan\left(\frac{2U}{1-U^2}\right)$, $$U = \frac{2\varphi_F \frac{\tan(\Gamma)}{\Gamma}}{\cos(\varepsilon) - \delta\sin(\varepsilon)\sin(2\beta)\frac{\tan(\Gamma)}{\Gamma}}, \text{ and}$$

$$\Gamma = [\delta^2 + (2\varphi_F)^2]^{1/2}$$

or an approximation thereof, where $$\varepsilon = \frac{-b + \sqrt{b^2 - 4ac}}{2a}$$

where $$a = 1 + \frac{1}{2}X - \sin(2\beta)\delta\frac{\pi}{4},$$

$$b = \frac{\pi}{2} + \sin(2\beta)\delta(1+X), \text{ and}$$

$$c = \sin(2\beta)\delta\frac{\pi}{2} - X,$$

wherein $X = A/Q_1$ when calculating S before thermal treatment and $X = B/Q_2$ when calculating S after thermal treatment, with $Q_1$ and $Q_2$ denoting values of Q before and after the thermal treatment.

3. The method of claim 2, wherein said approximation is $$S = \frac{1 + \frac{1}{3}\delta^2}{\cos(\varepsilon) - \delta\sin(\varepsilon)\sin(2\beta)}.$$

4. The method claim 2, wherein said values $Q_1$ and $Q_2$ are not equal and wherein at least one of them has been determined prior to manufacturing said sensor.

5. The method of claim 2, wherein $$\left|B + \frac{1}{V} \cdot \frac{\partial V}{\partial T}\right| < t$$

where t is a threshold value smaller than $7*10^{-5}$ 1/K, in particular smaller than $2*10^{-5}$ 1/K.

6. The method of claim 2, wherein $$\left|B + H + \frac{1}{V} \cdot \frac{\partial V}{\partial T}\right| < t$$

with H being a temperature dependence of the sensor scale factor associated with effects of birefringence present in the sensing fiber or with effects from packaging the sensor for application as a measurement device, and t is a threshold value smaller than $7*10^{-5}$ 1/K, in particular smaller than $2*10^{-5}$ 1/K.

7. The method of claim 6, wherein B is determined such that the sensor is temperature compensated for $\phi_F < 0.1$ rad.

8. The method of claim 6, wherein B is determined such that the sensor is temperature-compensated for $\phi_F > 0.3$ rad.

9. The method of claim 1, wherein during manufacturing of said retarder, said sensing fiber is substantially straight and wherein, after said manufacturing, said sensing fiber is bent to form a coil consisting of N>0 loops.

* * * * *